US 6,709,879 B2

(12) United States Patent
Yeh

(10) Patent No.: US 6,709,879 B2
(45) Date of Patent: Mar. 23, 2004

(54) METHOD FOR INSPECTING A PATTERN DEFECT PROCESS

(75) Inventor: Chia-Fu Yeh, Taipei (TW)

(73) Assignee: United Microelectronics Corporation, Hsin-Chu (TW)

( * ) Notice: Subject to any disclaimer, the term of this patent is extended or adjusted under 35 U.S.C. 154(b) by 181 days.

(21) Appl. No.: 10/038,691

(22) Filed: Jan. 2, 2002

(65) Prior Publication Data

US 2003/0124749 A1 Jul. 3, 2003

(51) Int. Cl.[7] .................. G01R 31/26; H01L 21/66; H01L 21/3205; G03C 5/00
(52) U.S. Cl. .................. 438/16; 438/585; 430/315
(58) Field of Search .................. 438/16, 585; 430/315

(56) References Cited

U.S. PATENT DOCUMENTS

| | | | | | |
|---|---|---|---|---|---|
| 5,667,941 | A | * | 9/1997 | Okamoto et al. ........... 430/313 |
| 5,892,224 | A | * | 4/1999 | Nakasuji .................... 250/310 |
| 5,960,106 | A | * | 9/1999 | Tsuchiya et al. ........... 382/144 |
| 6,466,882 | B1 | * | 10/2002 | Kang et al. .................... 702/84 |
| 6,509,593 | B2 | * | 1/2003 | Inoue et al. ................. 257/295 |
| 6,557,162 | B1 | * | 4/2003 | Pierrat ......................... 716/21 |

* cited by examiner

Primary Examiner—John F. Niebling
Assistant Examiner—Ron Pompey
(74) Attorney, Agent, or Firm—Merchant & Gould P.C.

(57) ABSTRACT

A method for inspecting a pattern defect process is disclosed, in which a layer is formed to raise a signal-to-noise ratio on the substrate. This invention also provides a method for inspecting a pattern defect process. First of all, a substrate is provided. Then, a device profile is formed on the substrate, wherein the device profile comprises a defect portion. Then, a layer is formed on the device profile and the substrate, wherein the layer has an etch selectivity different from the etch selectivity of the device profile. Next, the layer is removed partially to stop on the device profile and to cause a revere mask. Then, the device profile is etched on the substrate by using the revere mask as a mask. Finally, the revere mask is removed.

16 Claims, 3 Drawing Sheets

METHOD FOR INSPECTING A PATTERN DEFECT PROCESS

BACKGROUND OF THE INVENTION

1. Field of the Invention

The present invention generally relates to a method for forming a semiconductor device, and more particularly to a method for inspecting a pattern defect process.

2. Description of the Prior Art

Referring to FIG. 1, firstly, a substrate 100 is provided. The substrate 100 comprises silicon. The polysilicon layer 102 is formed on the substrate 100. The thickness of the polysilicon layer 102 is between about 3000 and 8000 angstroms. The polysilicon layer 102 is etched anisotropically to define gates 102a, 102b, and 102c. The sides of gates 102b and 102c have defects 103a and 103b. The thickness of defects 103a and 103b is about 1000 angstroms. It's very difficult to inspect defects 103a and 103b on side of gates 102a and 102b by visible light because the thickness of gates 102b and 102c is higher than and the defects 103a and 103b. Defect inspection is an important issue in a semiconductor fabrication.

For the foregoing reasons, there is a necessary for a method for inspecting a pattern defect process.

SUMMARY OF THE INVENTION

In accordance with the present invention, a method is provided for inspecting a pattern defect process that substantially can easily measure signal-to-noise ratio of defects on the substrate.

One object of the present invention is to provide a method for inspecting defect sensitivity process that can easily measure signal-to-noise ratio of defects on the substrate.

In order to achieve the above objects, the present invention provides a method for inspecting a pattern defect process, in which a layer is formed to raise signal-to-noise ratio on a substrate. This invention also provides a method for inspecting a pattern defect process. First of all, a substrate is provided. Then, a device profile is formed on the substrate, wherein the device profile comprises a defect portion. Then, a layer is formed on the device profile and the substrate, wherein the layer has an etch selectivity different from the etch selectivity of the device.. Next, the layer is removed partially to stop on the device profile and to cause a revere mask. Then, the device profile is etched on the substrate by using the revere mask as a mask. Finally, the revere mask is removed.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

FIGS. 2A–2E are cross-sectional views of a method for inspecting a pattern defect process in accordance with one preferred embodiment of the present invention.

Figure 1:
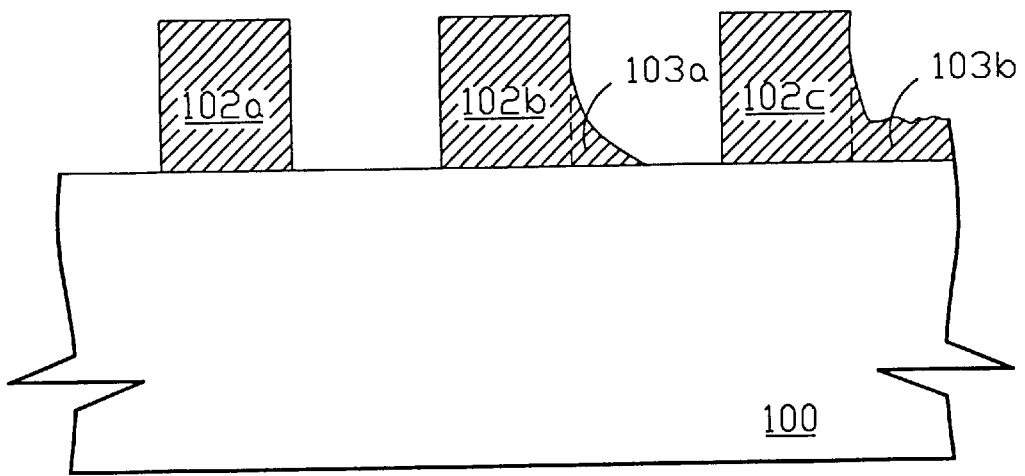
FIG. 1 shows a method of forming a device in the prior art.
Figure 2A:
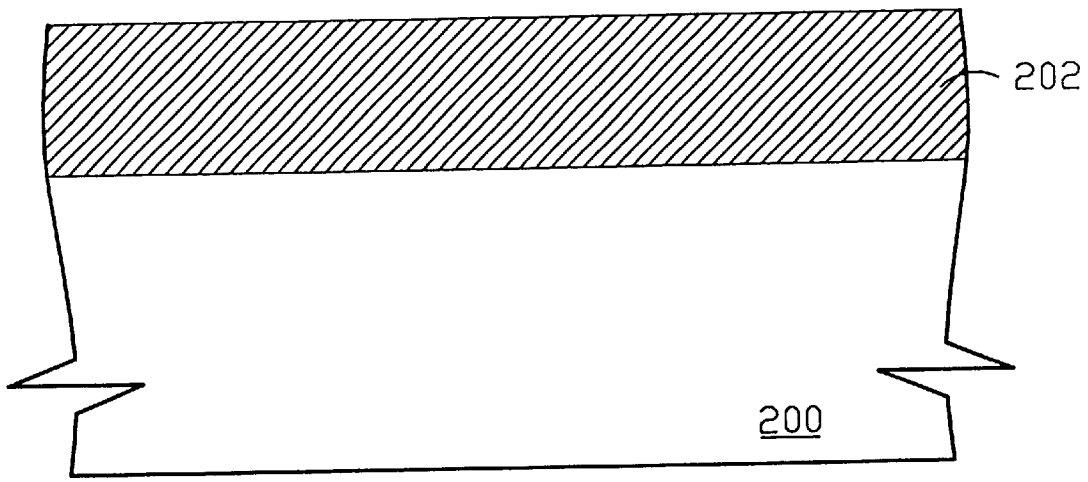
FIGS. 2A–2E are cross-sectional views of a method for inspecting a pattern defect process in accordance with one preferred embodiment of the present invention.

Referring to FIG. 2A, firstly, a substrate 200 is provided. The substrate 200 comprises silicon. The desired layer 202 such as SiO, SiN, or polysilicon is formed on the substrate 200. In the preferred embodiment, the desired layer 202 is chosen as polysilicon. The thickness of the desired layer 202 is between about 3000 and 8000 angstroms. In the embodiment, thickness of this layer is preferable about 5000 angstroms. The desired layer 202 is formed by using low pressure chemical vapor deposition (LPCVD).

Figure 2B:
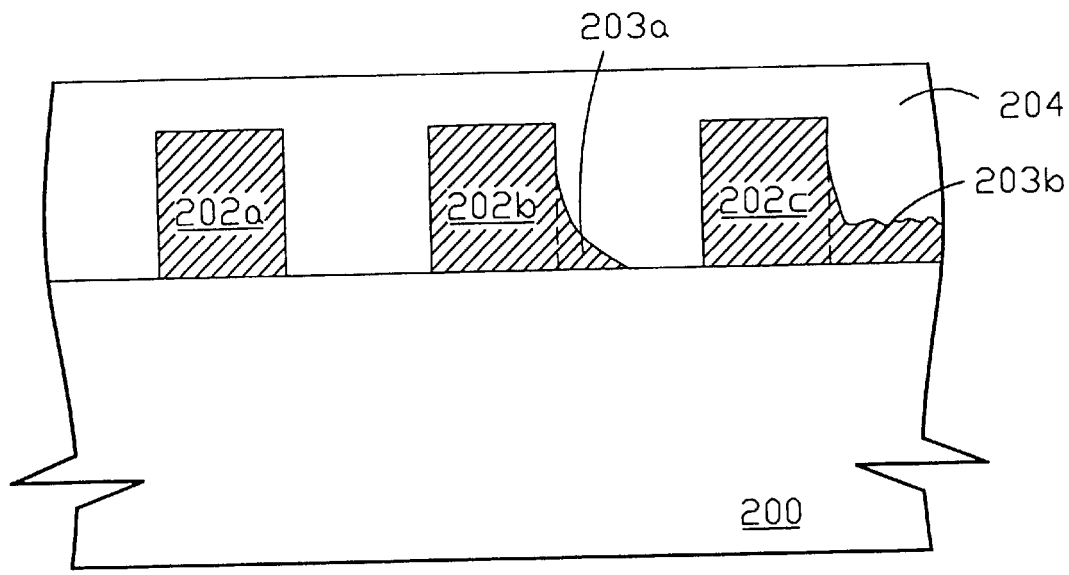

Referring to FIG. 2B, a portion of the desired layer 202 is removed to form the device profile 202a, 202b, and 202c on the substrate 200, wherein the device profile 202a, 202b, and 202c comprise defect portion 203b and 203c. The device profile 202a, 202b, and 202c comprise forming a gate device, capacitor, or any other convex pattern. In the preferred embodiment, the device profile 202a, 202b, and 202c are chosen as gate device. The sides of gate device 202b and 202c have defects 203a and 203b. The thickness of defects 203a and 203b is about 1000 angstroms. It's very difficult to inspect defects 203a and 203b on side of gate device 202b and 202c by visible light because the gate device 202b and 202c are higher than the defects 203a and 203b. This invention is to provide a layer 204 to solve this problem. The layer 204 is formed on the device profile 202a, 202b, and 202c and the substrate 200. The etch selectivity of the layer 204 is different from the etch selectivity of the device profile 202a, 202b, and 202c. The layer 204 is formed by using spin-coating method. The layer 204 comprises photoresist or silicon nitride. The thickness of the layer 204 is between about 4000 and 9000 angstroms. In the embodiment, thickness of this layer is higher than the device profile 202a, 202b, and 202c.

Figure 2C:
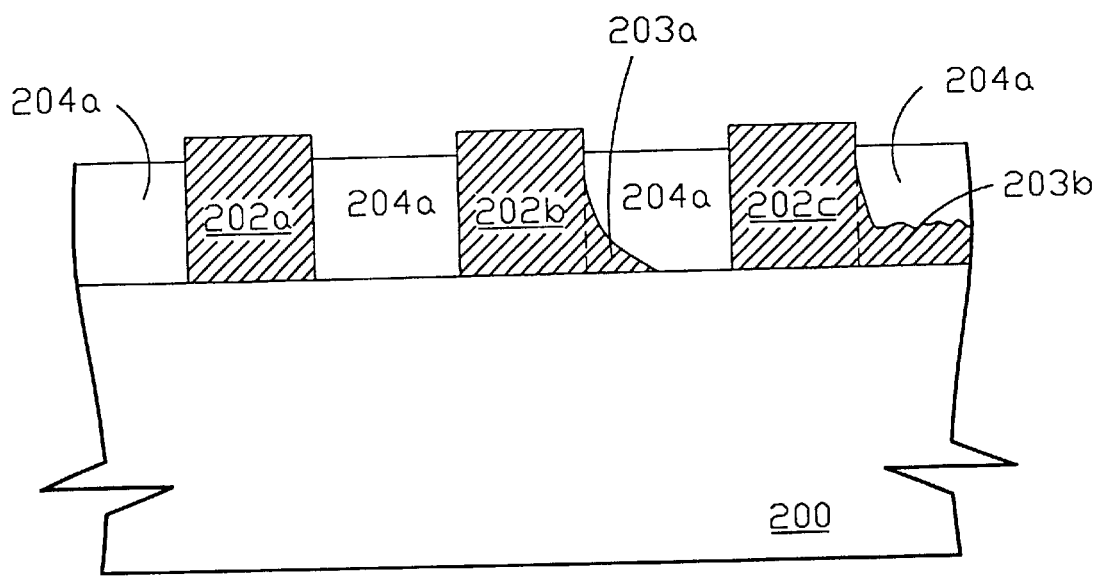

Referring to FIG. 2C, material of the layer 204 can be photoresist in a preferred embodiment. The layer 204 of photoresist is planarized under the device profile 202a, 202b, and 202c. The planarizing step comprises etching the layer 204 back. The etching method is isotropically etching. The layer 204 of photoresist is used of $H_2SO_4$ and $O_2$ as etchants. However, another the etching method is anisotropically etching. The material of the layer 204 can be silicon nitride in a second preferred embodiment. The layer 204 of silicon nitride is planarized under the device profile 202a, 202b, and 202c. The etching method is isotropically etching. The layer 204 of silicon nitride is used of $H_3PO_4$ chemistry or any other chemistry as etchants. The Chemical Mechanical Polishing (CMP) method is also used to planarize the layer 204 to stop on the device profile 202a, 202b, and 202c. The etching and CMP method cause overetch under the device profile 202a, 202b, and 202c and to form a reverse mask 204a.

Figure 2D:
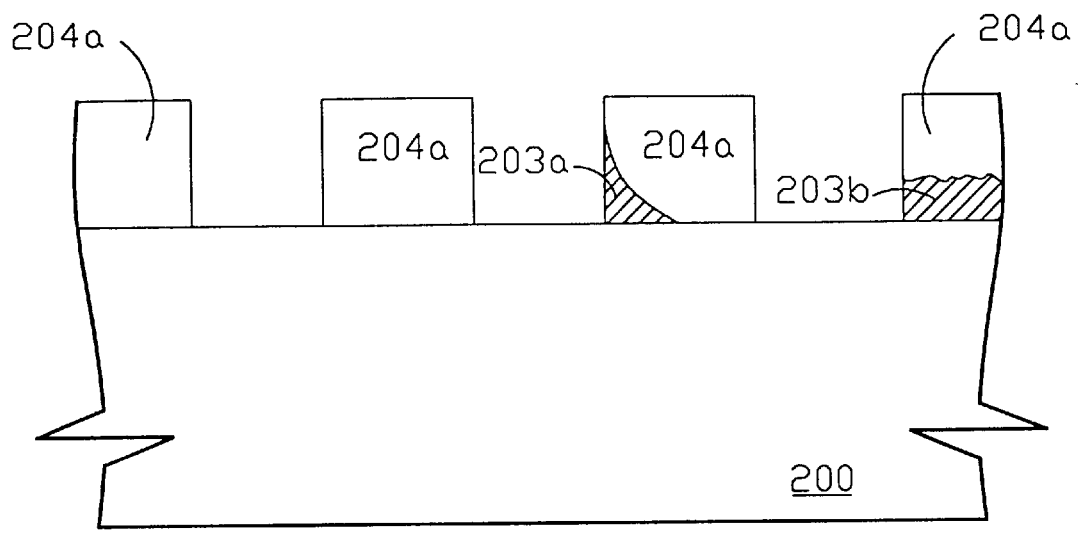

Referring to FIG. 2D, the device profile 202a, 202b, and 202c are removed by using the reverse mask 204a as a mask to remain the defect portion 203a and 203b on the substrate 200. The removing method is an anisotropically etch. The layer 204 is used of $Cl_2$, $HCl_2$, and $SiCl_4$ as etchants for the device profile 202a, 202b, and 202c. The device profile 202a, 202b, and 202c are etched to stop on the substrate 200. The defect portion 203a and 203b are kept in the reverse mask 204a.

Figure 2E:
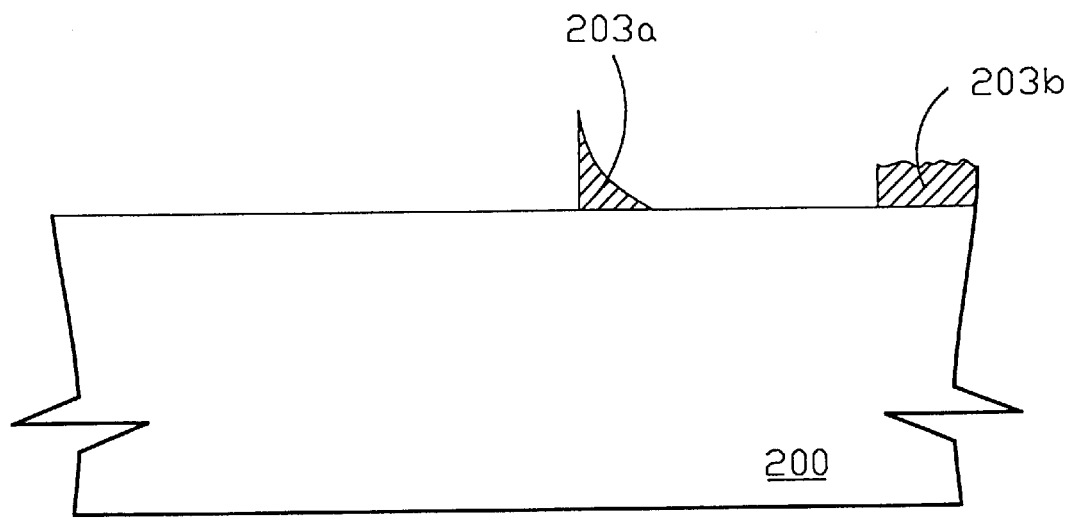

Referring to FIG. 2E, the reverse mask 204a is removed so as to remain the defect portion 203a and 203b on the substrate 200. It's very easy to inspect defects portion 203a and 203b on side of device profile 202a and 202b because they raise the signal-to-noise ratio on the substrate 200.

The method for inspecting a pattern defect process using the above explained method has the following advantage:

The present invention is to provide a method for inspecting a pattern defect process that means can easy measure signal-to-noise ratio of defects on the substrate.

While this invention has been described with reference to illustrative embodiments, this description is not intended or to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for inspecting a pattern defect process, said method comprising:
   providing a substrate;
   forming a device on said substrate, wherein said device comprises a defect portion;
   forming a layer on said device and said substrate, wherein said layer has an etch selectivity different from the etch selectivity of said device;
   removing said layer partially to stop on said device and to form a reverse mask;
   etching said device on said substrate by using said reverse mask as a mask; and
   removing said reverse mask.

2. The method for inspecting a pattern defect process according to claim 1, wherein said device comprises a gate.

3. The method for inspecting a pattern defect process according to claim 2, wherein thickness of said gate is between about 3000 and 8000 angstroms.

4. The method for inspecting a pattern defect process according to claim 2, wherein said device material is polysilicon.

5. The method for inspecting a pattern defect process according to claim 1, wherein said layer is formed by using spin coating method.

6. The method for inspecting a pattern defect process according to claim 1, wherein said layer is selected from the group consisting of photoresist and silicon nitride.

7. A method for raising a signal-to-noise ratio for defect inspection on a substrate, said method comprising:
   providing a device profile on said substrate, said device profile comprising a defect portion;
   forming a layer on said device profile and said substrate, wherein the etch selectivity of said layer is different from the etch selectivity of said device profile;
   planarizing said layer to form a reverse mask of said device profile;
   removing said device profile by using said reverse mask as a mask to remain said defect portion on said substrate; and
   removing said reverse mask so as to remain said defect portion on said substrate, whereby said defect portion is used to raise said signal-to-noise for defect inspection.

8. The method for raising a signal-to-noise ratio for defect inspection on a substrate according to claim 7, wherein said providing the device profile comprises:
   forming a polysilicon layer on said substrate; and
   removing a portion of the polysilicon layer to form said device profile.

9. The method for raising a signal-to-noise ratio for defect inspection on a substrate according to claim 8, wherein said device profile further comprises forming a gate device.

10. The method for raising a signal-to-noise ratio for defect inspection on a substrate according to claim 7, wherein said planarizing step comprises etching said layer back.

11. The method for raising a signal-to-noise ratio for defect inspection on a substrate according to claim 7, wherein said layer comprises coating a spinning-on layer.

12. The method for raising a signal-to-noise ratio for defect inspection on a substrate according to claim 11, wherein said spinning-on layer comprises a photoresist layer.

13. The method for raising a signal-to-noise ratio for defect inspection on a substrate according to claim 7, wherein said layer comprises a silicon nitride layer.

14. A method for raising a signal-to-noise ratio for defect inspection on a substrate, said method comprising:
   providing a gate device on said substrate, said gate device comprising a defect portion;
   forming a layer on said gate device and said substrate, wherein the etch selectivity of said layer is different from the etch selectivity of said gate device, wherein said layer is selected from the group consisting of photoresist and silicon nitride;
   etching said layer to form a reverse mask of said gate device;
   removing said gate device by using said reverse mask as a mask to remain said defect portion on said substrate; and
   removing said reverse mask so as to remain said defect portion on said substrate, whereby said defect portion is used to raise said signal-to-noise for defect inspection.

15. The method for raising a signal-to-noise ratio for defect inspection on a substrate according to claim 14, wherein said providing the gate device comprises:
   forming a polysilicon layer on said substrate; and
   removing a portion of the polysilicon layer to form said gate device.

16. The method for raising a signal-to-noise ratio for defect inspection on a substrate according to claim 14, wherein said layer comprises coating a spinning-on layer.

* * * * *